United States Patent [19]

Fraser et al.

[11] 3,975,252

[45] Aug. 17, 1976

[54] HIGH-RESOLUTION SPUTTER ETCHING

[75] Inventors: David Bruce Fraser, Berkeley Heights; David Yuan Kong Lou, North Plainfield, both of N.J.

[73] Assignee: Bell Telephone Laboratories, Incorporated, Murray Hill, N.J.

[22] Filed: Mar. 14, 1975

[21] Appl. No.: 558,489

[52] U.S. Cl.................................. 204/192; 156/7; 156/8
[51] Int. Cl.².................................. C23C 15/00
[58] Field of Search ............... 204/192, 298; 156/7, 156/8, 17, 18

[56] References Cited
UNITED STATES PATENTS

| | | | |
|---|---|---|---|
| 3,477,936 | 11/1969 | Gillery et al. | 204/192 |
| 3,615,956 | 10/1971 | Irving et al. | 156/17 |
| 3,649,503 | 3/1972 | Terry | 204/192 |
| 3,795,557 | 3/1974 | Jacob | 156/8 |
| 3,836,446 | 9/1974 | Tiefert | 204/192 |
| 3,880,684 | 4/1975 | Abe | 156/8 |
| 3,918,149 | 11/1975 | Roberts | 29/580 |
| 3,923,568 | 12/1975 | Bersin | 156/8 |
| 3,930,913 | 1/1976 | Jacob | 156/8 |
| 3,940,506 | 2/1976 | Heinecke | 427/38 |

OTHER PUBLICATIONS

Maissel et al. "Handbook of Thin-Film Technology", Mc-Graw-Hill, 1970, pp. 4-32.

*Primary Examiner*—John H. Mack
*Assistant Examiner*—Aaron Weisstuch
*Attorney, Agent, or Firm*—L. C. Canepa

[57] ABSTRACT

High-resolution sputter etching of a relatively thick layer (of, for example, gold) by directly utilizing a relatively thin layer of resist as a sputter-etching mask is often not feasible. In such a case, it is known to use a sputter-etching mask made of an etch-resistant material such as titanium interposed between the resist and the relatively thick layer. In accordance with the invention, patterning of the titanium is achieved by a technique of sputter etching in a halocarbon atmosphere.

20 Claims, 7 Drawing Figures

U.S. Patent  Aug. 17,1976  3,975,252

FORM MULTILAYER STRUCTURE

FORM PATTERN IN RESIST LAYER 12

FORM PATTERN IN LAYER 14 BY REACTIVE SPUTTER ETCHING IN HALOCARBON ATMOSPHERE

FORM PATTERN IN LAYERS 16, 18 BY REACTIVE SPUTTER ETCHING IN OXIDIZING ATMOSPHERE

REMOVE PORTIONS 27, 28, 29 AND FORM PATTERN IN LAYER 20 BY REACTIVE SPUTTER ETCHING IN HALOCARBON ATMOSPHERE. REMOVE RESIDUES BY CHEMICAL ETCHING

HIGH-RESOLUTION SPUTTER ETCHING

BACKGROUND OF THE INVENTION

This invention relates to pattern definition and, more particularly, to high-resolution sputter-etching techniques for forming such patterns.

It is known to use a patterned layer of titanium as a mask for sputter etching an underlying layer of gold (see, for example, U.S. Pat. No. 3,649,503, issued Mar. 14, 1972.) In turn, the gold pattern so formed may, for example, serve directly as a portion of an integrated circuit or as the x-ray absorptive component of a mask structure for use in x-ray lithography. (A particularly advantageous mask structure including a patterned gold layer is disclosed in a commonly-assigned copending application of G. A. Coquin, J. R. Maldonado, and D. Maydan, Ser. No. 442,921, filed Feb. 15, 1974, now U.S. Pat. No. 3,900,737, issued Aug. 19, 1975).

Of course, the intermediate masking layer of titanium itself must initially be patterned. In U.S. Pat. No. 3,649,503 the desired mask configuration in the titanium layer is delineated by forming a primary mask pattern in a photoresist layer deposited on the titanium. In accordance with the teachings of U.S. Pat. No. 3,649,503, those portions of the titanium that are not covered with the photoresist mask are removed by chemically etching the exposed titanium. The unetched or remaining titanium then serves as the aforementioned mask for sputter etching the underlying gold.

In a number of applications of practical importance wherein very high resolution in the gold layer is desired, it has been found that the resolution initially achieved in the resist layer is severely degraded due to undercutting of the resist layer and excessive etching of the titanium during the noted chemical etching step.

In particular, the significant advantages of submicron resolution achieved in an electron resist material by means of an electron beam exposure system often cannot be realized in practice in underlying layers due to the aforespecified undercutting phenomenon. In some cases, undercutting of as much as 5 microns due to chemical etching has been observed. This obviously completely vitiates the submicron resolution capabilities inherent in electron beam lithography. (A description of an electron beam exposure system capable of forming a submicron pattern in an electron resist layer is contained in a commonly-assigned copending application of R. J. Collier and D. R. Herriott, Ser. No. 461,876, filed Apr. 18, 1974, now U.S. Pat. No. 3,900,737, issued Aug. 19, 1975).

Attempts have also been made at patterning a resist-masked titanium layer by conventional sputter-etching techniques. But in many cases of practical importance, it has been found that the resist-mask material is etched away in the sputtering process before the underlying titanium is completely patterned. This is an especially vexing problem where very high resolution is desired because in such cases an extremely thin, and therefore easily etched away, layer of resist material is used.

SUMMARY OF THE INVENTION

An object of the present invention is a method for achieving high-resolution patterning of an intermediate masking layer.

More specifically, an object of this invention is a sputter-etching technique in which the intermediate masking layer is etched rapidly relative to the rate at which a very thin layer of overlying resist material is removed.

Briefly, these and other objects of the present invention are realized in a specific illustrative embodiment thereof in which a resist-masked titanium layer is reactively sputter etched in a halocarbon atmosphere. In this way a high-resolution pattern is formed in the titanium. In turn, the patterned titanium serves as a sputter-etching mask for patterning a relatively thick layer of gold.

BRIEF DESCRIPTION OF THE DRAWING

A complete understanding of the present invention and of the above and other objects may be gained from a consideration of the following detailed description presented hereinbelow in connection with the accompanying drawing in which.

DETAILED DESCRIPTION

Figure 1:
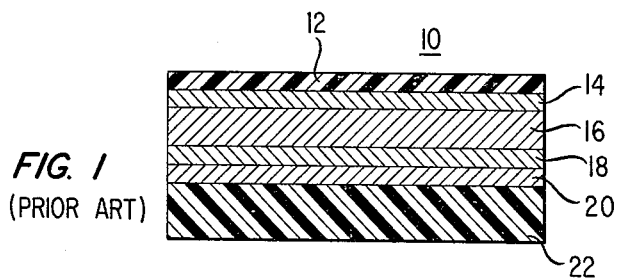
FIG. 1 shows a specific multilayer structure of the general type to be patterned in accordance with the principles of the present invention.

A specific illustrative multilayer structure 10 is shown in FIG. 1. Both the over-all structure of FIG. 1 and the fabrication techniques required to make the structure are straightforward and conventional. From top to bottom FIG. 1 comprises a 0.3-micron-thick layer 12 of, for example, an electron resist material; a 0.05-micron-thick layer 14 of, for example, titanium; a 0.8-micron-thick layer 16 of, for example, gold; a 0.1-micron-thick layer 18 of, for example, platinum, and a 0.1-micron-thick layer 20 of, for example, titanium. These aforespecified layers are supported on a substrate 22 which is, for example, made of polyethylene terephthalate. Polyethylene terephthalate is commercially available in the form of Mylar film. (Mylar is a registered trademark of E. I. Dupont de Nemours & Co.) Mylar film exhibits an attractive combination of properties such as mechanical strength, low x-ray absorption, resistance to organic solvents, optical transparency, thermal stability and ready availability in a variety of thicknesses with optical-quality surfaces.

In accordance with the principles of the present invention, the FIG. 1 structure is processed to form a high-resolution pattern in the relatively thick gold layer 16. Such a pattern supported on the Mylar substrate is, for example, useful as an x-ray mask, as is described in detail in the aforecited Coquin et al application.

Various electron resist materials suitable for use as the layer 12 of FIG. 1 are known. Both negative and positive electron resists are available. An illustrative list of such resists, together with a description of their properties and their utilization in electron lithography, is contained in a two-part article by L. F. Thompson entitled "Design of Polymer Resists for Electron Lithography", *Solid State Technology*, part 1: July 1974, pp. 27–30; part 2: August, 1974, pp. 41–46.

Figure 2:
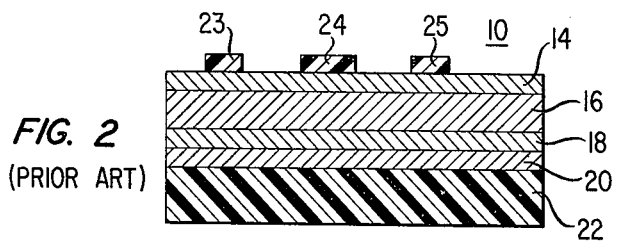
FIGS. 2 through 5 depict the form of the FIG. 1 structure at various stages of the patterning process.

By employing the techniques of electron lithography (for example, those described in the Thompson article and in the aforecited Collier et al application), a high-resolution pattern is formed in the topmost layer 12 of FIG. 1. The portions of the resist layer 12 that remain adhered to the underlying layer 14 after this initial processing step are represented in FIG. 2 by reference numerals 23 through 25. These remaining portions 23 through 25 serve to mask or protect directly underlying portions of the titanium layer 14 from being removed during the next processing step.

In accordance with the principles of this invention, the unprotected portions of the titanium layer 14 are then removed by a unique sputter-etching technique.

Various sputter-etching techniques are known in the art. As described, for example in "Sputter Etch Removal Rates of Insulators, Semiconductors and Conductors" by L. L. Fritz, *Solid State Technology*, December, 1971, pp. 43–48, these techniques involve physical erosion of a selectively masked target surface by ion bombardment. In particular, sputter etching generally involves a particle or ion beam incident perpendicularly upon the mask and target surfaces. The masking materials are chosen to be more impervious to sputter etching than are the unmasked target surfaces. The masking regions protect the directly underlying material from being eroded, with the result that the unprotected target layers are entirely removed with relatively sharply defined perpendicular side walls.

To achieve very high resolution in the electron resist layer 12 of FIG. 1, that layer must be very thin (typically about 0.3 microns). Hence, the resist portions 23 through 25 (FIG. 2) that serve to mask the titanium layer 14 of FIG. 2 are also very thin. If conventional sputter etching of the masked layer 14 is attempted, (for example, in a pure argon atmosphere), it is found that the masking portions 23 through 25 are etched away before the unmasked regions of the layer 14 are completely removed. If this occurs, it is, of course, impossible to achieve the desired patterning of the layer 14.

In accordance with the principles of the present invention, sputter etching of the structure shown in FIG. 2 is carried out in a gaseous halocarbon atmosphere established in a conventional diode sputter-etching chamber capable of either direct-current or radio-frequency activation. Specific illustrative halocarbons suitable for carrying out this step are: $CCl_4$, $CF_4$, $CHCl_3$, $CCl_3F$, $CCl_2F_2$, $CHCl_2F$, $CHClF_2$, $(CCl_2F)_2$ and $CCl_2FCClF_2$. More generally, halocarbons of the form $C_mCl_nF_{2m+2-n}$ or $C_mHCl_nF_{2m+1-n}$, where $m$ and $n$ are positive integers, are suitable for carrying out the specified step. These materials are relatively stable and non-corrosive compared, for example, to HF.

Advantageously, the halocarbon gas pressure in the sputter-etching chamber is established in the range 0.1–50 milliTorr. If the substrate of the structure being patterned is nonconductive, radio-frequency activation of the sputtering apparatus is necessary. In that case, activation frequencies in the range 150 kilohertz to several hundred megahertz may be employed. If direct-current activation is utilized (with a conductive substrate), voltages in the range 200 to 2000 volts are typically employed.

If a halocarbon atmosphere alone is established in the sputtering apparatus, ions formed during electrical activation of the apparatus bombard the top surfaces of the structure shown in FIG. 2. It is theorized that the bombarding particles comprise halogen ions or other ions, depending on the degree of disassociation of the halocarbon. In addition, it is significant that, in accordance with the principles of this invention, a chemical reaction occurs in the chamber between the halocarbon and the species that is sputtered (titanium), thereby forming highly volatile halides. As a result, the sputtering rate of the layer 14 is substantially enhanced over what it would be in say a pure argon atmosphere wherein physical bombardment only would occur.

Another advantageous property of the halogen atmosphere is that it reacts with any oxygen present in the sputtering chamber to limit drastically the effect of oxygen on both the resist portions 23 through 25 and the titanium layer 14. If it is not so captured, any oxygen present in the chamber tends to slow the etch rate of the layer 14 and to accelerate the etch rate of the resist portions 23 through 25, which tendencies are generally undesirable.

Figure 3:
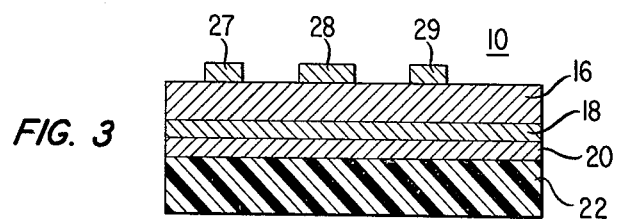

The aforedescribed sputter-etching step carried out in a halocarbon atmosphere is effective to remove the unmasked portions of the titanium layer 14. Subsequently, the resist portions 23 through 25 are removed by, for example, the process of sputter etching with an oxygen-containing gas mixture. At that point in the patterning process the multilayer structure appears as shown in FIG. 3. In FIG. 3, regions 27 through 29 comprise the previously resist-masked portions of the original titanium layer 14. Although relatively thin, these titanium portions 27 through 29 now serve as an effective etch-resistance mask for sputter etching of the relatively thick gold layer 16.

Before proceeding to describe the patterning of the gold layer 16, several variants of the aforedescribed reactive sputter-etching step will be specified. Instead of using a pure halocarbon atmosphere in that step, a mixture of gases may be established in the sputtering chamber. For example, one of the previously listed halocarbons may be mixed with an inert or substantially inert gas such as, for instance, argon, helium, krypton, neon, xenon or nitrogen. Illustratively, a mixture of 75–80% argon and 20–25% carbon tetrachloride at a pressure of 1–25 milliTorr has been determined to be an advantageous reactive sputter-etching atmosphere. In such a mixture, the added gas (for example, argon) enhances the aforedescribed physical bombardment process and, in addition, reduces the likelihood that harmful carbon deposits will occur on the material to be etched during the etching step.

Alternatively, a halocarbon may be combined with another reactive gas (for example, oxygen) to form the atmosphere required to etch the titanium layer 14 (FIG. 2). Such an added gas (oxygen) is particularly beneficial in minimizing carbon deposits but does have the deleterious effect of seriously reducing the titanium-to-resist-etch-rate ratio. Nevertheless, a mixture of less than 20% oxygen combined with a halocarbon at a pressure of 1–25 milliTorr is a feasible alternative for some applications of practical interest.

Patterning of the titanium-masked gold layer 16 shown in FIG. 3 is advantageously carried out by sputter etching in an oxidizing atmosphere. Such an atmosphere causes a highly etch-resistant oxide layer to be formed on the surface portions of the titanium regions 27 through 29. As a result, those titanium regions are eroded only to a small extent during the sputter etching of the relatively thick unmasked gold portions of the layer 16.

Various oxidizing atmospheres are suitable for sputter etching the gold layer 16 (and also the platinum layer 18) shown in FIG. 3. For example, any inert or substantially inert gas (argon, helium, krypton, neon, xenon or nitrogen) combined with air or combined with oxygen is suitable. Or a halocarbon of the type specified above may be combined with oxygen to form the atmosphere required to etch the layer 16. Or air or oxygen alone provides a satisfactory sputtering atmosphere. Pressures of 1–50 milliTorr and mixtures with 10–100% air or oxygen have been determined to be feasible for this step of the process.

Switching from a halocarbon atmosphere to an oxidizing one simply involves changing the gases present in the sputtering chamber. Removal from the chamber of the structure being patterned is not necessary during this change. Accordingly, handling of the structure is eliminated and a low-cost continuous process is thereby made possible.

Figure 4:
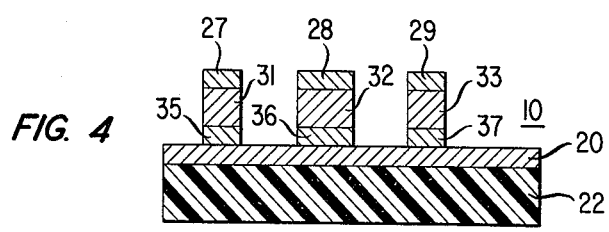

The gold and platinum layers 16 and 18, respectively, shown in FIG. 3 are patterned by the aforementioned sputter-etching process carried out in an oxidizing atmosphere to form the structure depicted in FIG. 4. As illustrated in FIG. 4, the titanium mask regions 27 through 29 directly overlie portions 31 through 33 of the gold layer 16 which were protected during the last-mentioned sputter-etching step. In addition, corresponding portions 35 through 37 of the platinum layer 18 located directly under the gold portions 31 through 33 remain unetched. The bottom titanium layer 20 shown in FIG. 4 remains virtually intact (unpatterned) during the selective etching of the layers 16 and 18. This is so due to the formation on the layer 20 of a highly etch-resistant oxide layer. Accordingly, the substrate 22 is protected from damage by the layer 20 during removal of the unmasked portions of the layers 16 and 18.

Figure 5:
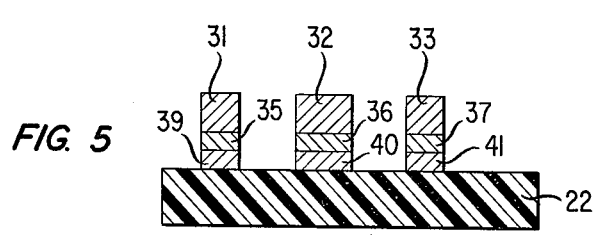
Figure 6:
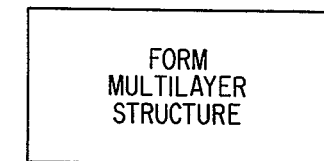
FIG. 6 is a five-block flow diagram whose respective descriptive legends correspond to FIGS. 1 through 5.
Figure 6:
Figure 6:
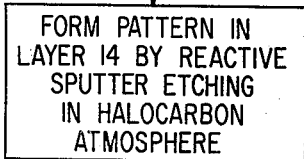
Figure 6:
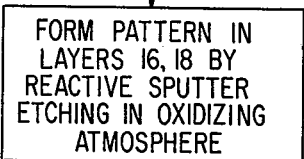
Figure 6:
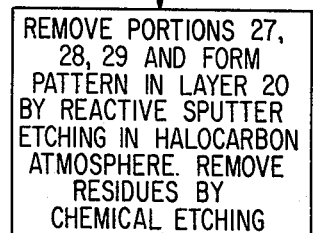

Subsequently, a halocarbon atmosphere of the type previously described is reestablished in the sputtering chamber, and the titanium regions 27 through 29 and the unprotected portions of the bottom titanium layer 20 are etched until they are almost completely removed. At that point sputter etching is terminated. The structure is removed from the sputtering chamber and the titanium residues are removed by a suitable chemical etchant (for example, $HBF_4$). In this way, damage to the substrate 22 is minimized. The final patterned structure is then as shown in FIG. 5. (In FIG. 5 the regions 39 through 41 constitute the unetched portions of the bottom titanium layer 20.)

The specific structure shown in FIGS. 1 through 5 is only illustrative of a variety of multilayer arrangements that may be patterned in accordance with the principles of the present invention. In some applications the resist layer 12 may comprise a photoresist or an x-ray resist instead of an electron resist material. (Patterns may thus be defined in the resist layer 14 by light or x-rays.) The layer 14 may be made of nickel or chromium or aluminum (or other group IV elements such as silicon or germanium) instead of titanium. In fact, any material that sputter etches in a halocarbon atmosphere rapidly relative to an overlying resist material and that is capable of forming a stable etch-resistant surface oxide layer may be utilized for the layer 14. Moreover, the relatively thick layer 16 to be patterned may, for example, comprise permalloy, silver, platinum, palladium, rhodium, silicon, gallium arsenide, germanium, tungsten, silicon dioxide or silicon nitride instead of gold. In addition, the layer 18 which, for example, facilitates electroplating of gold to form the layer 16 may comprise palladium, rhodium or nickel instead of platinum. And in some applications the layer 18 may be omitted altogether. Furthermore, the layer 20, which generally serves to enhance adherence to the substrate 22 as well as serving as a sputter-etch-stop layer, may in some structural arrangements be also omitted. If not omitted, the layer 20 may alternatively be made of nickel, chromium or aluminum.

Figure 7:
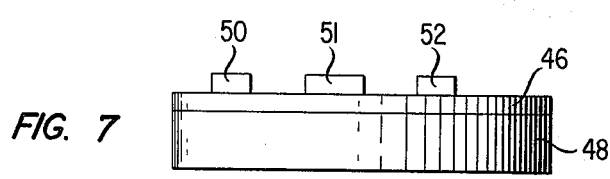
FIG. 7 represents another patterned structure made by the method of the present invention.

A simplified structure of the general type represented in FIG. 7 may be fabricated by the process of the present invention. FIG. 7 corresponds to the basic x-ray mask structure depicted in FIG. 4 of the aforecited Coquin et al. application. In FIG. 7 a substrate 46 made of a thin optically transparent sheet of polyethylene terephthalate is stretched over and bonded to a supporting element 48 which illustratively is made of a strong, durable and dimensionally stable material such as a suitable metal, silicon or fused silica formed in the shape of a ring. A high-resolution gold pattern, represented by stripes 50 through 52 in FIG. 7, is formed on the substrate 46 by utilizing the sputter-etching process described hereinbefore.

In fabricating the simplified structure of FIG. 7, the gold layer to be patterned is deposited directly on the substrate 46 without forming any intervening layers between the gold layer and the substrate 46. In accordance with the principles of the present invention, only overlying layers of titanium and resist (not shown in FIG. 7) are included in the original multilayer structure from which the simplified FIG. 7 mask is made by following the aforedescribed sputter-etching method.

The process of the present invention is generally applicable to the fabrication of a variety of other high-resolution electronic structures including, for example, magnetic bubble circuits, gallium arsenide field-effect transistors, gallium arsenide distributed-feedback lasers and silicon bipolar microwave transistors.

Finally, it is to be understood that the above-described processes are only illustrative of the application of the principles of the present invention. In accordance with those principles, numerous other relatd processes may be devised by those skilled in the art without departing from the spirit and scope of the invention.

What is claimed is:

1. A method adapted for patterning a layer on which is disposed an intermediate masking layer, said intermediate masking layer having disposed thereon a pattern of resist material that exposes selected surface portions of said intermediate masking layer, said method comprising the step of sputter etching said intermediate masking layer in a halocarbon atmosphere to form in said intermediate layer a pattern corresponding to that defined by said resist material, said method comprising the additional step of sputter etching said layer to be patterned through said intermediate mask to form in said layer to be patterned a pattern corresponding to that defined by said resist material, wherein said second-mentioned sputter-etching step is carried out in an oxidizing atmosphere.

2. A method as in claim 1 wherein said halocarbon atmosphere consists of an essentially pure halocarbon atmosphere that is capable of ionic dissociation in said chamber and of chemically reacting with material of the intermediate masking layer to form volatile compounds in said chamber.

3. A method as in claim 2 wherein said halocarbon atmosphere consists of a halocarbon selected from the group consisting of $C_mCl_nF_{2m+2-n}$ and $C_mHCl_nF_{2m+1-n}$, where $m$ and $n$ are positive integers.

4. A method as in claim 2 wherein said halocarbon atmosphere consists of $CCl_4$.

5. A method as in claim 4 wherein said $CCl_4$ is established at a pressure in the range of approximately 0.1–50 milliTorr.

6. A method as in claim 1 wherein said halocarbon atmosphere comprises a gaseous mixture of a halocarbon and an inert or substantially inert gas.

7. A method as in claim 6 wherein said inert or substantially inert gas is selected from the group consisting of argon, helium, krypton, neon, xenon and nitrogen.

8. A method as in claim 1 wherein said halocarbon atmosphere consists of an essentially pure halocarbon atmosphere that is capable of ionic dissociation and of chemically combining with species from said intermediate masking layer to form volatile compounds in said chamber.

9. A method as in claim 8 wherein said halocargon atmosphere consists of a halocarbon selected from the group consisting of $C_mCl_nF_{2m+2-n}$ and $C_mHCl_nF_{2m+1-}$, where $m$ and $n$ are positive integers.

10. A method as in claim 8 wherein said halocarbon atmosphere consists of $CCl_4$.

11. A method as in claim 10 wherein said $CCl_4$ atmosphere is established at a pressure in the range of approximately 0.1–50 milliTorr.

12. A method as in claim 1 wherein said halocarbon atmosphere comprises a gaseous mixture of a halocarbon and an inert or substantially inert gas.

13. A method as in claim 12 wherein said inert or substantially inert gas is selected from the group consisting of argon, helium, krypton, neon, xenon and nitrogen.

14. A method for defining a high-resolution pattern in a relatively thick layer of a multilayer structure that comprises a substrate, the relatively thick layer being deposited on said substrate, a relatively thin intermediate masking layer deposited on said relatively thick layer, and a relatively thin layer of resist material deposited on said intermediate masking layer, said method comprising the steps of defining a pattern in said resist material to expose selected surface portions of said intermediate masking layer, sputter etching the exposed portions of said intermediate masking layer in a halocarbon atmosphere to expose selected surface portions of said relatively thick layer, and sputter etching the exposed portions of said relatively thick layer in an oxidizing atmosphere to form a high-resolution pattern in said relatively thick layer.

15. A method as in claim 14 wherein said resist material comprises an electron resist material and wherein said defining step comprises defining a pattern in said resist material by electron lithography.

16. A method as in claim 15 wherein said intermediate masking layer comprises a material which, when sputtered in said halocarbon atmosphere, combines with the halocarbon atmosphere to form a volatile halide compound and which, when sputtered in said oxidizing atmosphere, forms an etch-resistant oxide film on the surface portions of said intermediate masking layer.

17. A method as in claim 16 wherein said intermediate masking layer comprises a material selected from the group consisting of titanium, nickel, chromium, silicon, germanium and aluminum, and wherein a relatively thin layer of this same material is interposed between said relatively thick layer and said substrate, said method comprising the further step of sputter etching said interposed layer in a halocarbon atmosphere.

18. A method as in claim 14 wherein said halocarbon atmosphere comprises a gas selected from the group consisting of $C_mCl_nF_{2m+2}$-and $C_mHCl_nF_{2m+1-n}$, where $m$ and $n$ are positive integers.

19. A method for fabricating an x-ray mask structure by defining a high-resolution pattern in a relatively thick x-ray transparent substrate, the relatively thick layer being deposited on said substrate, a relatively thin masking layer deposited on said relatively thick layer, and a relatively thin layer of electron resist material deposited on said x-ray absorptive layer, said method comprising the steps of defining a pattern in said electron resist material to expose selected surface portions of said intermediate masking layer, sputter etching the exposed portions of said intermediate masking layer in a carbon tetrachloride atmosphere to expose selected surface portions of said relatively thick x-ray-absorptive layer, and sputter etching the exposed portions of said relatively thick x-ray-absorptive layer in an oxidizing atmosphere to form a high-resolution x-ray-absorptive pattern in said relatively thick layer deposited on said x-ray-transparent substrate.

20. A method as in claim 19 wherein said intermediate masking layer comprises titanium.

* * * * *